United States Patent
Ito et al.

(10) Patent No.: US 6,684,360 B1
(45) Date of Patent: Jan. 27, 2004

(54) TRANSMISSION APPARATUS, RECEPTION APPARATUS, TRANSMISSION METHOD AND RECEPTION METHOD, EACH FOR EFFICIENTLY TRANSMITTING ERROR INFORMATION

(75) Inventors: Asanobu Ito, Yawata (JP); Minoru Nishioka, Kobe (JP); Tatsushi Bannai, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/469,789

(22) Filed: Dec. 22, 1999

(30) Foreign Application Priority Data

Dec. 25, 1998 (JP) .......................................... P10-369175
Dec. 25, 1998 (JP) .......................................... 10-371478

(51) Int. Cl.[7] .......................... H03M 13/00; H02H 3/05
(52) U.S. Cl. ....................................... 714/752; 714/48
(58) Field of Search ................................ 714/752, 746, 714/758, 712, 48, 49; 370/242

(56) References Cited

U.S. PATENT DOCUMENTS

| | | | | |
|---|---|---|---|---|
| 4,001,692 A | * | 1/1977 | Fenwick et al. | ............. 714/797 |
| 6,233,079 B1 | * | 5/2001 | Miyamori | ..................... 369/14 |
| 6,278,537 B1 | * | 8/2001 | Miyamori | ................... 398/119 |

FOREIGN PATENT DOCUMENTS

JP    5-81785    4/1993

* cited by examiner

Primary Examiner—Christine T. Tu
(74) Attorney, Agent, or Firm—Wenderoth, Lind & Ponack, L.L.P.

(57) ABSTRACT

Disclosed is a digital data transmission system comprising a transmission apparatus and a reception apparatus. The transmission apparatus generates error location information at which an error occurs in each block, in accordance with a data signal including a video signal composed of a first number of words and generated for each block, and an error information signal indicating presence or absence of an error corresponding to the data signal, multiplexes the generated error location information and the data signal into a multiplexed signal, and then, transmits the multiplexed signal through a transmission line. On the other hand, the reception apparatus receives, through the transmission line, a transmission data signal including a data signal including a video signal composed of a predetermined first number of words and generated for each block and an error pointer signal indicating error location information corresponding to the data signal, demultiplexes the received transmission data signal into the data signal and the error pointer signal, and generates error information indicating presence or absence of the error corresponding to the data signal, in accordance with the error pointer signal. The data signal is decompressed in accordance with the generated error information, and this leads to reduction of occurrence of errors.

20 Claims, 7 Drawing Sheets

Fig.5 FORMAT OF TRANSMISSION DATA TD

TRANSMISSION APPARATUS, RECEPTION APPARATUS, TRANSMISSION METHOD AND RECEPTION METHOD, EACH FOR EFFICIENTLY TRANSMITTING ERROR INFORMATION

BACKGROUND OF THE INVENTION

1. Field of the Invention

The present invention relates to a transmission apparatus, a reception apparatus, a transmission method, and a reception method, and in particular, to a transmission apparatus, a reception apparatus, a transmission method and a reception method, each for efficiently transmitting error information during transmission of digital data such as a video signal, an audio signal, file data or the like.

2. Description of the Related Art

Figure 8:
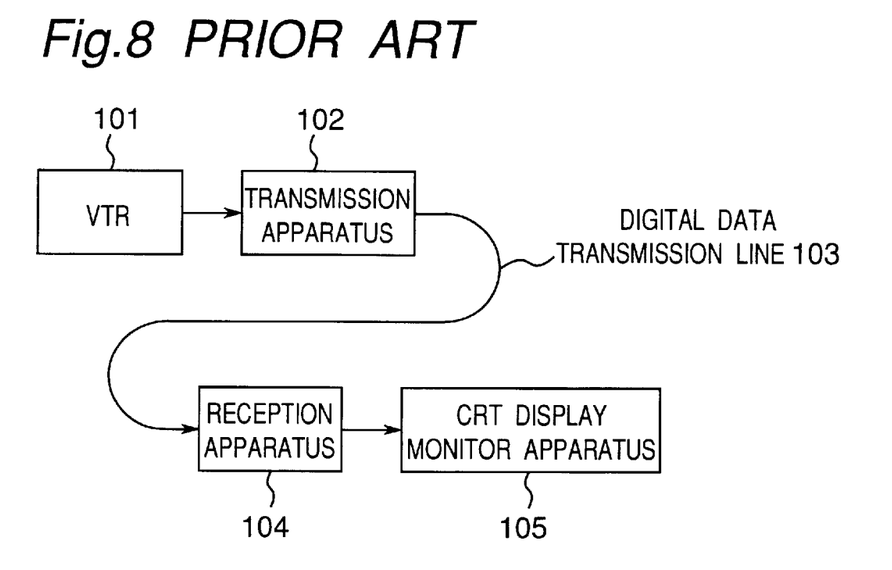
FIG. 8 is a block diagram of a constitution of a digital data transmission system according to the prior art.

FIG. 8 is a block diagram of a constitution of a digital data transmission system according to the prior art. Referring to FIG. 8, a compression-recording type VTR 101 records a data signal such as a video signal and an audio signal including an error correction code, on a magnetic tape during recording, while the VTR 101 reproduces a reproduced signal from the data signal such as the video signal and the audio signal including the error correction code from the magnetic tape during reproduction. Then, the VTR 101 executes error correction for the reproduced signal, and then, outputs the error-corrected reproduced signal to a transmission apparatus 102. Thereafter, the transmission apparatus 102 converts the inputted reproduced signal into a transmission data signal based on the standard for a digital data transmission line 103 in conformity with the standard for SDTI (Serial Data Transport Interface: the interface for transmitting a compressed digital video signal) specified by SMPTE (Society of Motion Picture and Television Engineers) 305M, for example, and then, the transmission apparatus 102 transmits the transmission data signal to a reception apparatus 104 through the digital data transmission line 103.

On the other hand, the reception apparatus 104 receives the transmission data signal through the digital data transmission line 103, the reception apparatus 104 decodes the received transmission data signal into the video signal in conformity with the standard for a CRT display monitor apparatus 105 and the audio signal, and the reception apparatus 104 outputs the decoded video signal to the CRT display monitor apparatus 105, and this leads to that an image of the video signal is displayed on the CRT display monitor apparatus 105. Also, the reception apparatus 104 outputs the audio signal to a speaker (not shown), which converts the audio signal into a sound of the audio signal and then outputs the sound.

However, when an uncorrectable error occurs during reproduction by the VTR 101, the VTR 101 cannot inform the reception apparatus 104 of the occurrence of the error. Therefore, the reception apparatus 104 performs normal typical decoding regardless of presence or absence of the error, and this causes noise on the CRT display monitor apparatus 105.

Moreover, in order to transmit an error information signal generated by the VTR 101, it is necessary to add at least one-bit error information signal to each word of the video signal. However, the digital data transmission line 103 in conformity with the standard for the above-mentioned SDTI (Serial Data Transport Interface), for example, cannot transmit the above-mentioned error information signal, because a band for transmitting any information signal other than the video signal cannot be sufficiently ensured due to a limitation of the standard for the digital data transmission line 103. Moreover, the error correction code is added to the data signal in order to correct the error in the digital data transmission line 103. Signal processing based on a unit of word or byte is convenient for this addition, and thus the error information signal is not transmitted.

SUMMARY OF THE INVENTION

It is an object of the present invention to provide a transmission apparatus, a reception apparatus, a transmission method and a reception method, which do not produce noise when a video signal is reproduced at the receiving side and which can efficiently transmit an error information signal from the transmission apparatus to the reception apparatus.

According to the first aspect of the present invention, there is provided a transmission apparatus comprising:

information generating means for generating error location information at which an error occurs in each block, in accordance with a data signal including a video signal composed of a predetermined first number of words and generated for each block, and an error information signal indicating presence or absence of the error corresponding to the data signal; and transmitting means for multiplexing the error location information generated by the information generating means and the data signal into a multiplexed signal, and transmitting the multiplexed signal through a transmission line.

The above-mentioned transmission apparatus preferably further comprises converting means for converting a data signal including a video signal composed of a predetermined second number of words and generated for each block, into a data signal including a video signal composed of the first number of words and generated for each block, and outputting the converted data signal to the information generating means and the transmitting means.

Also, according to the second aspect of the present invention, there is provided a reception apparatus comprising:

receiving means for receiving a transmission data signal including a data signal and an error pointer signal through a transmission line, the data signal including a video signal composed of a predetermined first number of words and generated for each block, the error pointer signal indicating error location information at which an error occurs corresponding to the data signal;

demultiplexing means for demultiplexing the transmission data signal received by the receiving means into the data signal and the error pointer signal, and outputting the data signal and the error pointer signal; and information generating means for generating error information indicative of presence or absence of the error corresponding to the data signal in accordance with the error pointer signal demultiplexed by the demultiplexing means.

The above-mentioned reception apparatus preferably further comprises converting means for converting the data signal outputted from the demultiplexing means and including the video signal composed of the first number of words and generated for each block, into a data signal including the video signal composed of a predetermined second number of words and generated for each block, and outputting the converted data signal.

Further, according to the third aspect of the present invention, there is provided a transmission method including the following steps of:

generating error location information which an error occurs in each block, in accordance with a data signal including a video signal composed of a predetermined first number of words and generated for each block, and an error information signal indicating presence or absence of the error corresponding to the data signal; and multiplexing the generated error location information and the data signal into a multiplexed signal, and transmitting the multiplexed signal through a transmission line.

The above-mentioned transmission method preferably further includes a step of converting a data signal including a video signal composed of a predetermined second number of words and generated for each block, into a data signal including a video signal composed of the first number of words and generated for each block.

Still further, according to the fourth aspect of the present invention, there is provided a reception method including the following steps of:

receiving a transmission data signal including a data signal and an error pointer signal through a transmission line, the data signal including a video signal composed of a predetermined first number of words and generated for each block, the error pointer signal indicating error location information at which an error occurs corresponding to the data signal;

demultiplexing the received transmission data signal into the data signal and the error pointer signal, and outputting the data signal and the error pointer signal; and generating error information indicative of presence or absence of the error corresponding to the data signal, in accordance with the demultiplexed error pointer signal.

The above-mentioned reception method preferably further comprises a step of converting a data signal including a video signal composed of the first number of words and generated for each block, into a data signal including a video signal composed of a predetermined second number of words and generated for each block, and outputting the converted data signal.

In the above-mentioned aspects of the present invention, the error location information indicates information of a head location of the error in the block of the data signal or the video signal. Also, the transmission line is preferably a digital data transmission line in conformity with a standard for SDTI (Serial Data Transport Interface) specified by SMPTE (Society of Motion Picture and Television Engineers) 305M.

BRIEF DESCRIPTION OF THE DRAWINGS

Various objects, features and advantages of the present invention will be apparent from the following description of preferred embodiments taken in conjunction with the accompanying drawings, wherein.

DETAILED DESCRIPTION OF THE PREFERRED EMBODIMENTS

Preferred embodiments of the present invention will be described below with reference to the accompanying drawings. In the drawings, the same reference numerals and symbols indicate the similar components.

Figure 1:
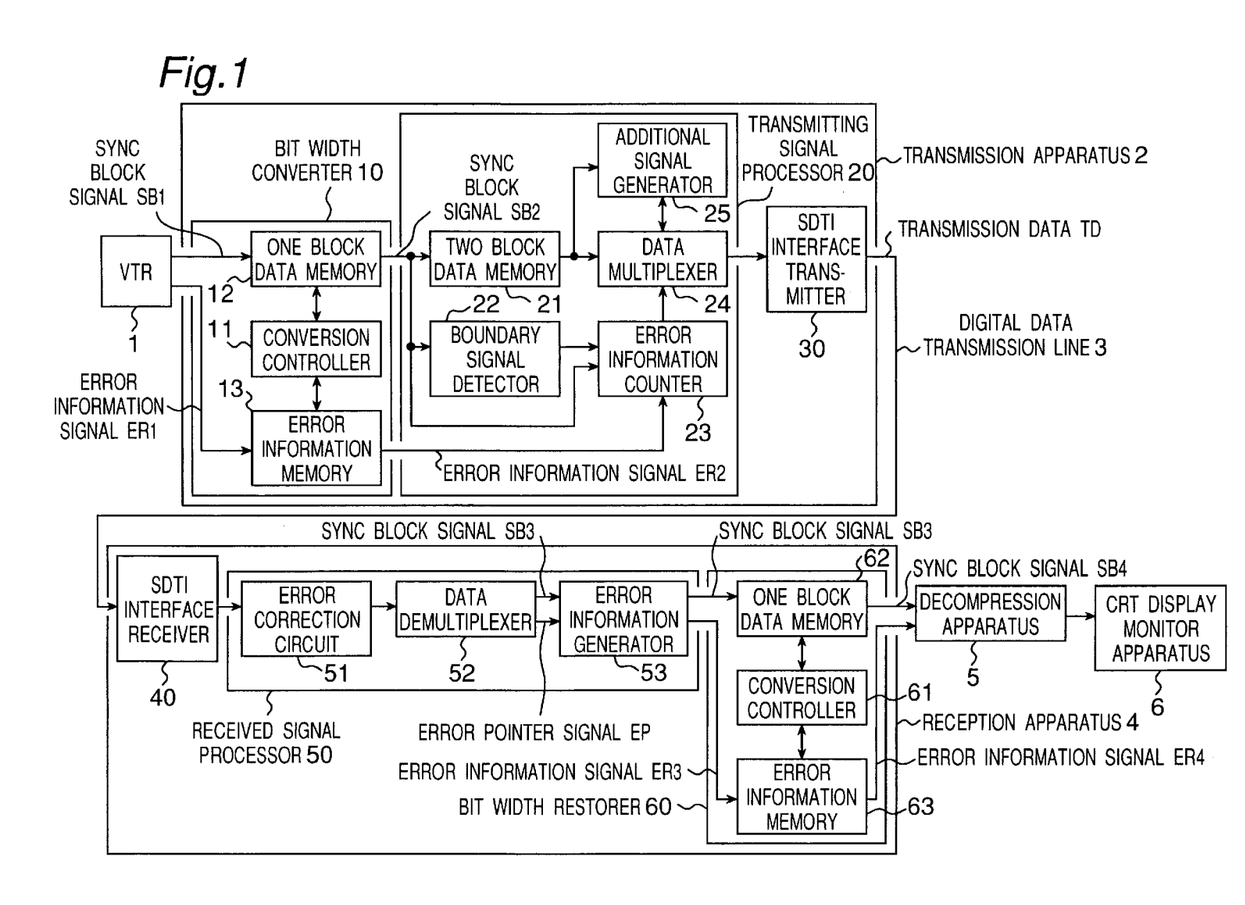
FIG. 1 is a block diagram of a constitution of a digital data transmission system comprising a transmission apparatus 2 and a reception apparatus 4, according to a preferred embodiment of the present invention.

FIG. 1 is a block diagram of a constitution of a digital data transmission system comprising a transmission apparatus 2 and a reception apparatus 4, according to the preferred embodiment of the present invention. Referring to FIG. 1, the transmission apparatus 2 is constituted by comprising a bit width converter 10, a transmitting signal processor 20, and an SDTI interface transmitter 30, and the reception apparatus 4 is constituted by comprising an SDTI interface receiver 40, a received signal processor 50 and a bit width restorer 60. In this case, the SDTI interface transmitter 30 is connected to the SDTI interface receiver 40 through a digital data transmission line 3 in conformity with the standard for SDTI (Serial Data Transport Interface) specified by SMPTE (Society of Motion Picture and Television Engineers) 305M, for example, so that transmission data TD including a video signal, an audio signal or the like is transmitted in a form of packet from the SDTI interface transmitter 30 to the SDTI interface receiver 40 through the digital data transmission line 3.

Referring to FIG. 1, 1 denotes a digital VTR (hereinafter referred to as a VTR), which is commercially available as a model number HD-d5, for instance. The VTR 1 compresses a data signal including the video signal and the audio signal, and then, records the compressed data signal on a magnetic tape in a form of SYNC blocks in a unit of 85 words into which the compressed data signal is divided. On the other hand, the VTR 1 reproduces the compressed data signal from the magnetic tape and executes error correction for the data signal, and then, generates an error-corrected SYNC block signal SB1 and an error information signal ER1 indicating whether or not each word of the SYNC block signal SB1 has an error, and outputs the SYNC block signal SB1 and the error information signal ER1 to the bit width converter 10 of the transmission apparatus 2. In this case, one word is composed of eight bits, and the SYNC block signal SB1 includes a video signal, an audio signal and other information.

Figure 2:
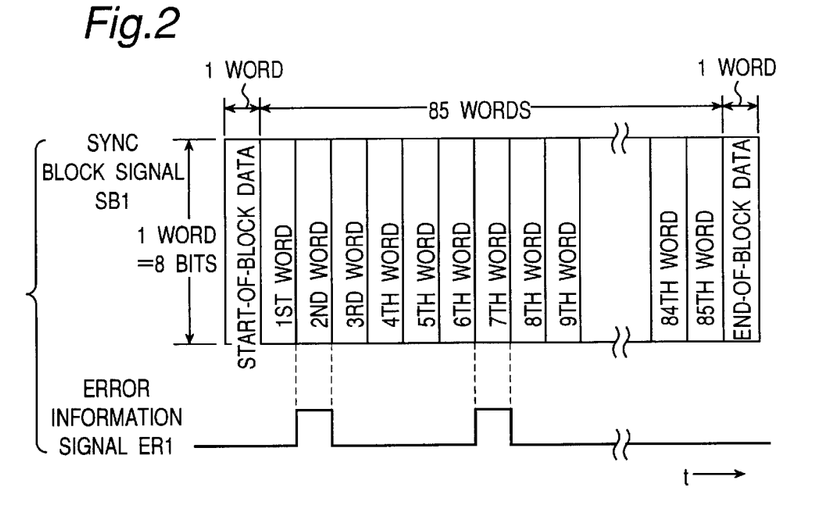
FIG. 2 is a timing chart of one example of a format of a SYNC block signal SB1 and an error information signal ER1 shown in FIG. 1.

FIG. 2 is a timing chart of one example of a format of the SYNC block signal SB1 and the error information signal ER1 shown in FIG. 1. As shown in FIG. 2, the SYNC block signal SB1 comprises one SYNC block composed of 8 bits×85 words, start-of-block data composed of one word, and end-of-block data composed of one word. The start-of-block and end-of-block data indicate a boundary between the SYNC blocks and are added to the head and tail of the SYNC block, respectively. Moreover, the error information signal outputted from the VTR 1 is generated for each word of the SYNC block signal SB1. The error information signal becomes a high level when an error occurs, while the error information signal becomes a low level when any error does not occur.

The bit width converter 10 comprises a conversion controller 11 for controlling bit width conversion, a one block data memory 12 for temporarily storing one block of the SYNC block signal SB1, and an error information memory 13. The one block data memory 12 temporarily stores the SYNC block signal SB1 outputted from the VTR 1, and then, outputs the SYNC block signal to a two block data memory 21, a boundary signal detector 22 and an error information counter 23, which are provided in the transmitting signal processor 20. Moreover, the error information memory 13 temporarily stores the error information signal ER1 outputted from the VTR 1, and then, outputs the error information signal to the error information counter 23 provided in the transmitting signal processor 20. Furthermore, as shown in FIG. 4, the conversion controller 11 changes timings of writing and reading of the SYNC block signal SB1 stored in the one block data memory 12 to and from the one block data memory 12, so as to bit-width-convert the SYNC block signal SB1 composed of 8 bits×85 words into a SYNC block signal SB2 composed of 9 bits×76 words, and then, the conversion controller 11 outputs the SYNC block signal SB2. Moreover, as shown in FIGS. 2 and 3, the conversion controller 11 changes timings of writing and reading of the error information signal ER1 stored in the error information memory 13 to and from the error information memory 13, so as to convert the error information signal ER1 into an error information signal ER2 to convert the location of the error information signal of each word of the SYNC block signal SB1 composed of 8 bits×85 words into the location of the error information signal of each corresponding word of the SYNC block signal SB2 composed of 9 bits×76 words corresponding to the above-mentioned bit width conversion of the SYNC block signal, and then, the conversion controller 11 outputs the error information signal ER2.

Referring to FIG. 4, 71 denotes a direction of bit processing from LSB (Least Significant Bit) in a direction of bit width, and 72 denotes a direction of word processing, namely, a direction of time axis. As is apparent from FIG. 4, data of a first word 81, a second word 82, a third word 83, a fourth word 84, . . . of the SYNC block signal SB1 composed of 8 bits×85 words are converted into data of a first word 91, a second word 92, a third word 93, a fourth word 94, . . . of the SYNC block signal SB2 composed of 9 bits×76 words by the bit-width conversion of the bit width converter 10.

Figure 3:
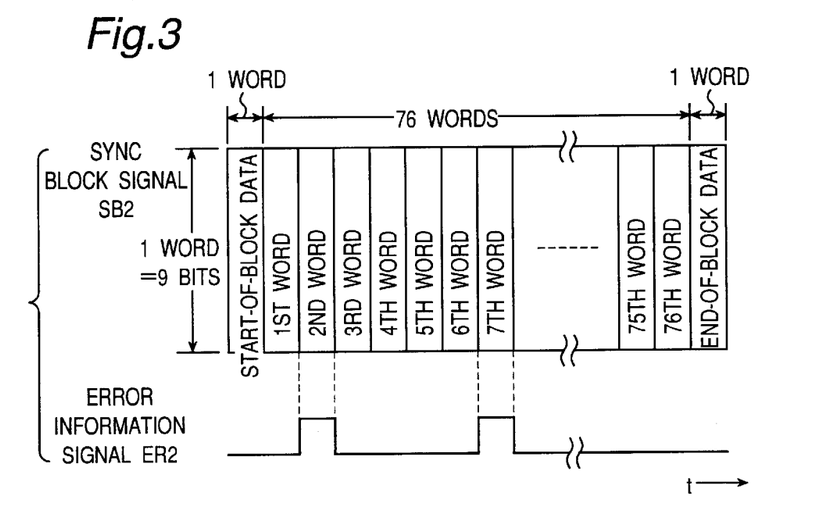
FIG. 3 is a timing chart of one example of a format of a SYNC block signal SB2 and an error information signal ER2 shown in FIG. 1.
Figure 4:
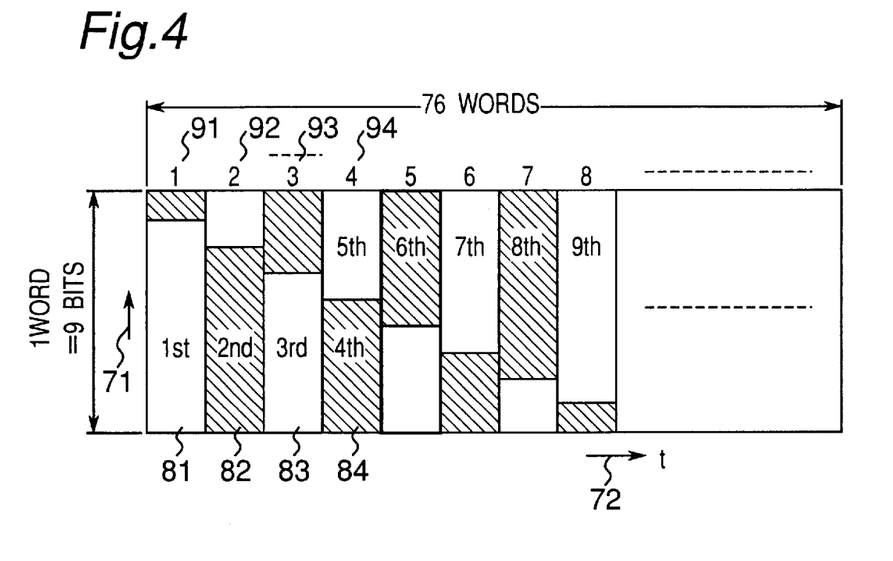
FIG. 4 is a block diagram of one example of the format of the SYNC block signal SB2, showing a signal processing by a bit width converter 10 shown in FIG. 1.

Moreover, in one example of conversion of the error information signal of FIGS. 2 and 3, the error information signal ER1 having the high level at a location of the second word of the SYNC block signal SB1 is converted into the error information signal ER2 having the high level at a location of the second word of the SYNC block signal SB2. The error information signal ER1 having the high level at a location of a seventh word of the SYNC block signal SB1 is converted into the error information signal ER2 having the high level at a location of the seventh word of the SYNC block signal SB2.

That is, the error information signal ER1 is converted into the error information signal ER2 at a timing of presence of the last bit of each word of the SYNC block signal SB1. Therefore, for example, an eighth word of the SYNC block signal SB2 shown in FIG. 4 includes the last bit of the eighth and the last bit of the ninth words of the SYNC block signal SB1, and therefore, the error information signal ER2 becomes an OR of the error information signal ER1 of the eighth word and the error information signal ER1 of the ninth word.

The transmitting signal processor 20 comprises the two block data memory 21 for temporarily storing two blocks of the SYNC block signal SB2, the boundary signal detector 22, the error information counter 23, a data multiplexer 24 and an additional signal generator 25.

The two block data memory 21 temporarily stores two blocks of the SYNC block signal SB2 outputted from the one block data memory 12, and then, outputs the SYNC block signal SB2 to the data multiplexer 24 and the additional signal generator 25. Moreover, the boundary signal detector 22 detects start-of-block data which is a boundary signal indicating a boundary between the SYNC blocks included in the inputted SYNC block signal SB2, and then, the boundary signal detector 22 outputs a detected signal to the error information counter 23, so that a count value of the error information counter 23 is reset to zero, and the error information counter 23 starts a counting operation. Thereafter, the error information counter 23 counts a serial number of each word of the SYNC block signal SB2 so as to increment the count value by one for each word of the inputted SYNC block signal SB2. Then, the error information counter 23 outputs to the data multiplexer 24, data of the serial number of the word of the SYNC block signal SB2, which is the count value of each SYNC block signal SB2 at the first time when the error information signal ER2 becomes the high level. That is, the error information counter 23 detects a head location of the error in each SYNC block signal SB2, and then, outputs the data thereof to the data multiplexer 24. This data of the head location of the error is called an error pointer.

It is to be noted that the error information counter 23 may be adapted to be incremented with a clock synchronized to the SYNC block signal SB2 without any SYNC block signal SB2 being inputted to the error information counter 23.

Figure 5:
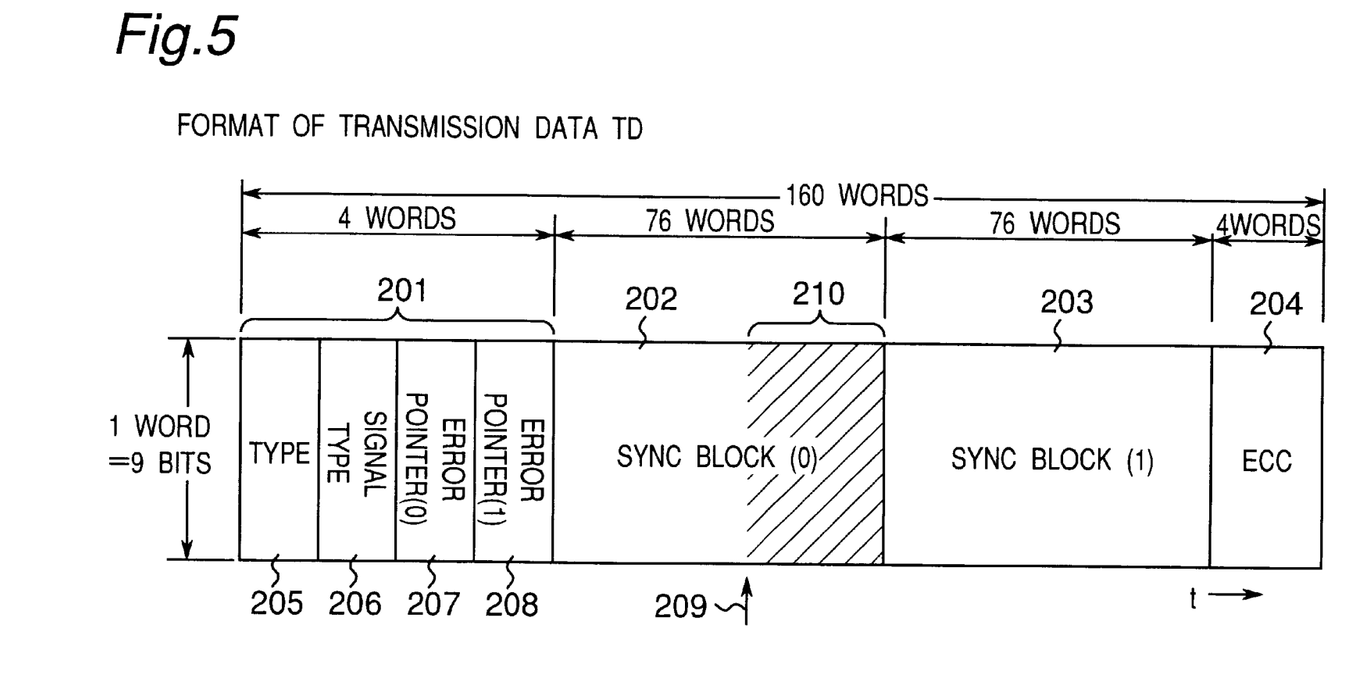
FIG. 5 is a block diagram of one example of a format of transmission data TD shown in FIG. 1.

Moreover, the additional signal generator 25 generates the following (1) to (3) in accordance with the inputted SYNC block signal SB2 and the data of the error pointer inputted from the error information counter 23 through the data multiplexer 24 to the additional signal generator 25:

(1) a TYPE composed of one word, which is an identifier specified by the above-mentioned SDTI;

(2) a signal type composed-of one word, which is information indicating the contents of the SYNC block signal; and (3) an error correction code (ECC) composed of 4 words, with respect to data except the error correction code upon constituting the transmission data TD as shown in FIG. 5.

The additional signal generator 25 outputs the above (1) to (3) to the data multiplexer 24. In this case, the error correction code composed of 4 words is adapted to detect and correct the error in the digital data transmission line 3. Thus, this error correction code cannot avoid any error when an uncorrectable error is already included in the data signal outputted from the VTR 1.

Some types of lengths of the packet of the transmission data TD transmitted in a form of packet in accordance with the above-mentioned SDTI are specified by SMPTE (Society of Motion Picture and Television Engineers). In the present preferred embodiment, the length of the packet is set to 160 words, and the above-mentioned transmission data TD includes header information 201 composed of four words, two SYNC blocks 202 and 203, and an error correction code (ECC) 204 composed of four words. As shown in FIG. 5, the data multiplexer 24 adds data 207 and 208 on two blocks of error pointers generated by the error information counter 23, a TYPE 205, a signal type 206 and the error correction code (ECC) 204 generated by the additional signal generator 25, to the inputted two SYNC blocks 202 and 203, and then, generates the transmission data TD. Then, the data multiplexer 24 outputs the transmission data TD to the SDTI interface transmitter 30.

Furthermore, the SDTI interface transmitter 30 processes the input transmission data TD, such as a signal conversion, a signal amplification and the like, for achievement of a predetermined interface. Then, the SDTI interface transmitter 30 transmits the processed transmission data TD to the SDTI interface receiver 40 of the reception apparatus 4 through the digital data transmission line 3.

On the other hand, the SDTI interface receiver 40 of the reception apparatus 4 receives the transmission data TD through the digital data transmission line 3, and processes the received transmission data TD, such as the signal conversion, the signal amplification and the like, for achievement of a predetermined interface. Then, the SDTI interface receiver 40 outputs the processed transmission data TD to an error correction circuit 51 of the received signal processor 50.

Figure 6:
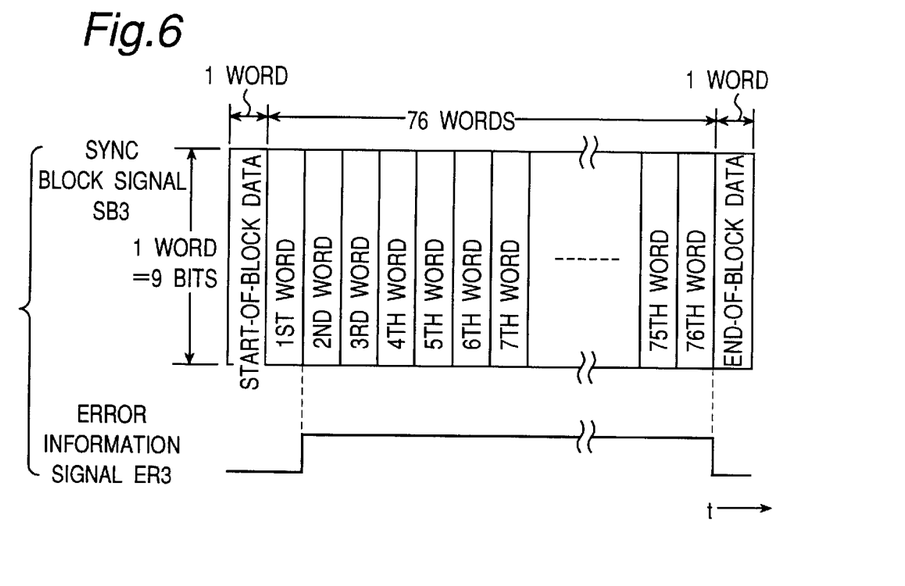
FIG. 6 is a timing chart of one example of a format of a SYNC block signal SB3 and an error information signal ER3 shown in FIG. 1.

The received signal processor 50 comprises the error correction circuit 51, a data demultiplexer 52 and an error information generator 53. The error correction circuit 51 executes error correction for the data except the error correction code in accordance with the error correction code (ECC) added to the received transmission data TD, and then, outputs the error-corrected transmission data TD except the error correction code to the data demultiplexer 52. Then, the data demultiplexer 52 demultiplexes each of the inputted error-corrected transmission data TD except the error correction code into at least of, two blocks of a SYNC block signal SB3 and the data of the error pointer. Then, the data demultiplexer 52 outputs the SYNC block signal SB3 and an error pointer signal EP including data of the error pointer, to the error information generator 53. The error information generator 53 outputs the inputted SYNC block signal SB3 as it is to a one block data memory 62 of the bit width restorer 60, and also generates an error information signal ER3 having the high level from a word of occurrence of the error indicated by the error pointer signal to the last 76-th word in each SYNC block signal SB3 as shown in FIG. 6, in accordance with the error pointer signal indicating the head location of occurrence of the error in each input block. The error information generator 53 outputs the error information signal ER3 to an error information memory 63 of the bit width restorer 60.

The bit width restorer 60 comprises a conversion controller 61 for controlling bit width decoding, the one block data memory 62 for temporarily storing one block of the SYNC block signal SB3, and the error information memory 63. The one block data memory 62 temporarily stores the SYNC block signal SB3 outputted from the error information generator 53, and then, outputs the SYNC block signal to a decompression apparatus 5. Moreover, the error information memory 63 temporarily stores the error information signal ER3 outputted from the error information generator 53, and then, outputs the error information signal to the decompression apparatus 5. Furthermore, the conversion controller 61 changes timings of writing and reading of the SYNC block signal SB3 stored in the one block data memory 62 to and from the one block data memory 62 in order to execute a bit width decoding that is reverse of the bit width conversion shown in FIG. 4, thereby bit-width decoding the SYNC block signal SB3 composed of 9 bits×76 words into the SYNC block signal SB1 composed of eight bits×85 words, and then, the conversion controller 61 outputs the SYNC block signal SB1. Moreover, as shown in FIGS. 6 and 7, the conversion controller 61 changes timings of writing and reading of the error information signal ER3 stored in the error information memory 63 to and from the error information memory 63, thereby converting the error information signal ER3 into an error information signal ER4 so as to convert the location of the error information signal of each corresponding word of the SYNC block signal SB3 composed of 9 bits×76 words into the location of the error information signal of each word of a SYNC block signal SB4 composed of 8 bits×85 words, corresponding to the above-mentioned bit width decoding of the SYNC block signal, and then, the conversion controller 61 outputs the error information signal ER4.

Figure 7:
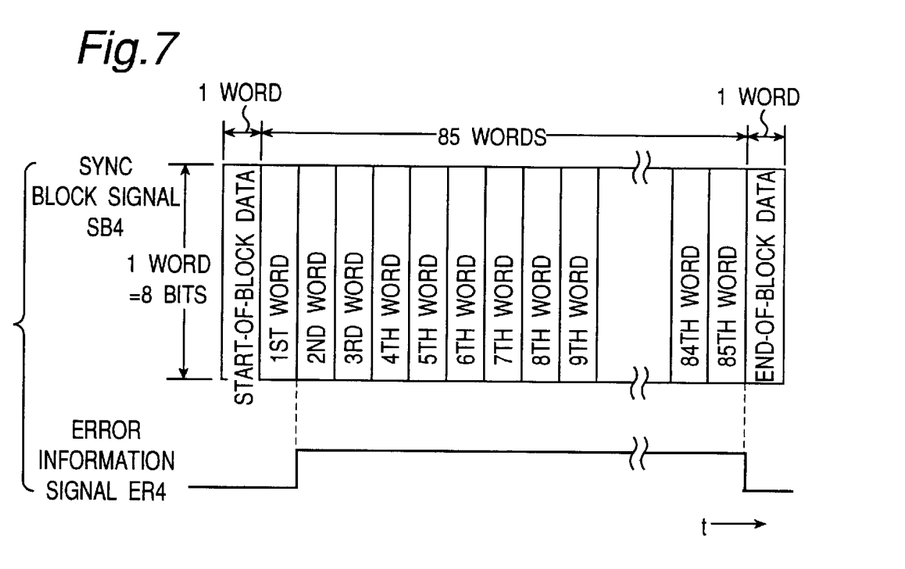
FIG. 7 is a timing chart of one example of a format of a SYNC block signal SB4 and an error information signal ER4 shown in FIG. 1.

In one example of the decoding of the error information signal of FIGS. 6 and 7, the error information signal ER3 having the high level starting at the second word of the SYNC block signal SB3 is converted into the error information signal ER4 having the high level starting at the second word of the SYNC block signal SB4.

Furthermore, the decompression apparatus 5 decompresses the data signal so as to extract the video signal, the audio signal or the like in the SYNC block in accordance with the input SYNC block signal SB4 and error information signal ER4, and then, converts the decompressed data signal into a video signal in a form of a video format such as NTSC or the like and an audio signal. The decompression apparatus 5 outputs the video signal to a CRT display monitor apparatus 6, so as to display an image of the video signal on the CRT display monitor apparatus 6. Also, the decompression apparatus 5 outputs the audio signal to a speaker (not shown), which converts the audio signal into a sound of the audio signal and outputs the sound.

In the digital data transmission system constituted as described above, the processing to be performed at the time of occurrence of the error will be described with reference to FIG. 5. Now, when a certain SYNC block 202 is reproduced by the VTR 1 and the uncorrectable error is detected, the transmission apparatus 2 receives the error information signal ER1 indicating the first location at which the uncorrectable error occurs in the SYNC block (0) 202, writes the information on the error information signal ER1 to the error pointer (0) 207, and sends out the data to the digital data transmission line 3. A value larger than the value of the last location of the SYNC block (1) 203 is written to the error pointer 208 of the error-free SYNC block (1) 203. In the decompression apparatus 5 provided at the subsequent stage of the reception apparatus 4, since all the data in the SYNC block (0) 202 becomes invalid after occurrence of the error, the decompression apparatus executes normal typical decompression for the SYNC block (0) 202 up to the head location 209 of occurrence of the error, and performs a process for correcting the error portion by using the information in the SYNC block positioned at the same location in a preceding field or a preceding frame without use of data information 210 following the location 209. Then, the decompression apparatus 5 outputs the processed NTSC signal to the CRT display monitor apparatus 6.

According to the above-mentioned method, the decompression apparatus 5 at the side of the reception apparatus 4 performs the normal typical decompression regardless of presence or absence of the uncorrectable error, and this leads to preventing from occurrence or generation of noise. Thus, the decompression apparatus 5 decompresses only the normal data information, and executes any appropriate processing other than typical processing, for erroneous information, and this leads to reduction of the noise.

MODIFIED PREFERRED EMBODIMENT

Figure 9:
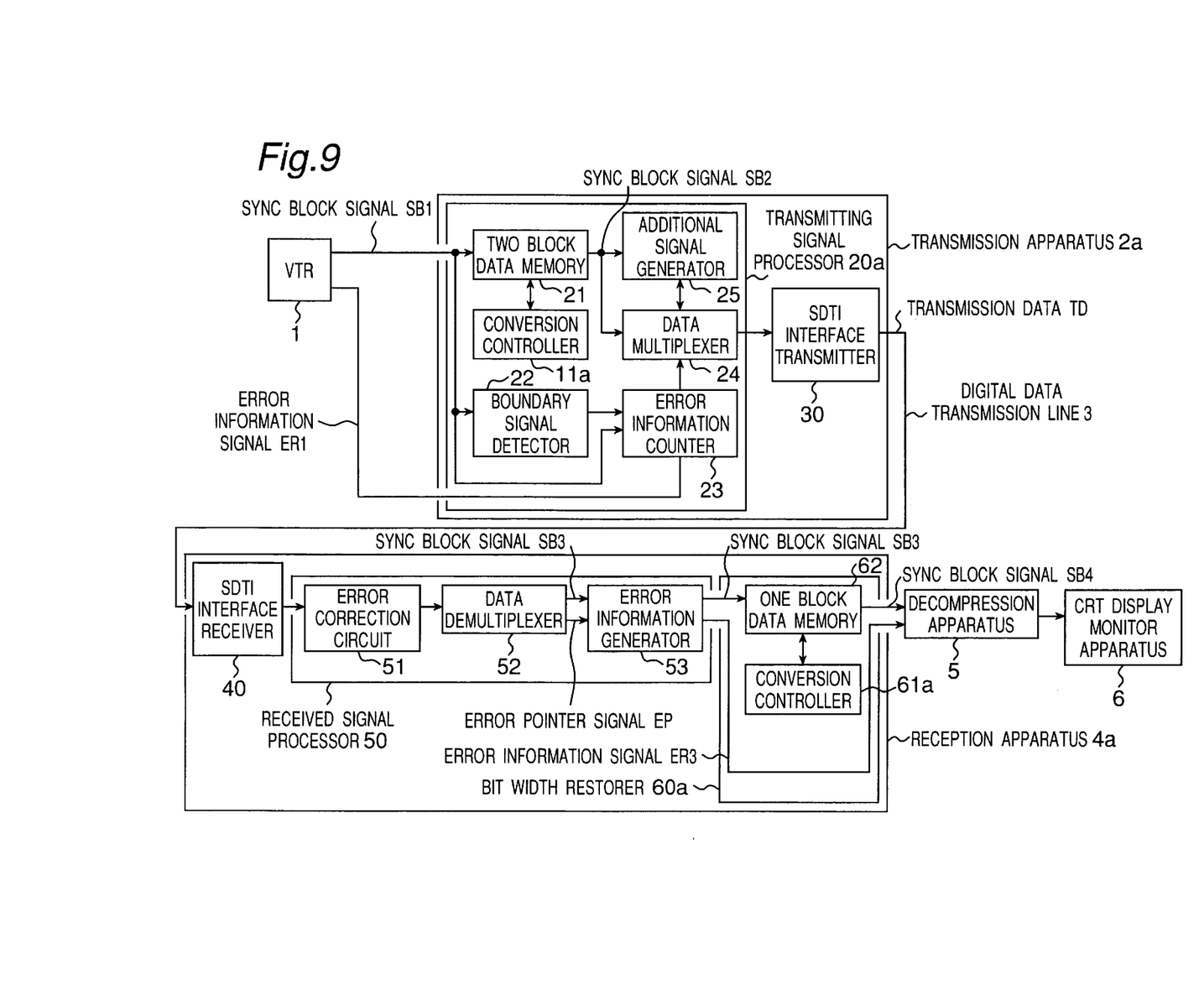
FIG. 9 is a block diagram of a constitution of a digital data transmission system comprising a transmission apparatus 2a and a reception apparatus 4a, according to a modified preferred embodiment of the present invention.

FIG. 9 is a block diagram of a constitution of a digital data transmission system comprising a transmission apparatus 2a and a reception apparatus 4a, according to a modified preferred embodiment of the present invention. The digital data transmission system of the present modified preferred embodiment differs from that of the above-mentioned preferred embodiment shown in FIG. 1 in the following (1) and (2).

(1) The transmission apparatus 2a does not comprise the bit width converter 10 but comprises a conversion controller 11a connected to the two block data memory 21 provided in a transmitting signal processor 20a in order to perform a bit width conversion of the SYNC block signal SB1. It is to be noted that the error information signal ER1 outputted from the VTR 1 is inputted to the error information counter 23 as it is.

(2) A bit width restorer 60a provided in the reception apparatus 4a does not comprise the error information memory 63. A conversion controller 61a does not perform any bit width decoding of the error information signal ER3 but executes only a bit width decoding of the SYNC block signal SB3.

These differences will be described in detail below.

Referring to FIG. 9, the SYNC block signal SB1 outputted from the VTR 1 is inputted to the two block data memory 21 provided in the transmitting signal processor 20a. As shown in FIG. 4, the conversion controller 11a changes timings of writing and reading of each SYNC block signal SB1 stored in the two block data memory 21 to and from the two block data memory 21, thereby bit-width converting the SYNC block signal SB1 composed of 8 bits×85 words into the SYNC block signal SB2 composed of 9 bits×76 words, and then, the conversion controller 11a outputs the SYNC block signal SB2 to the data multiplexer 24 and the additional signal generator 25. On the other hand, the error information signal ER1 outputted from the VTR 1 is inputted to the error information counter 23 as it is. The error information counter 23 detects a head location of the error of each SYNC block signal SB1, and then, outputs data of the error pointer to the data multiplexer 24, and this leads to that this data of the error pointer is inserted into the transmission data TD.

On the other hand, the conversion controller 61a provided in the bit width restorer 60a of the reception apparatus 4a changes timings of writing and reading of the SYNC block signal SB3 stored in the one block data memory 62 to and from the one block data memory 62 in order to execute a bit width decoding that is reverse of the bit width conversion shown in FIG. 4, thereby bit-width decoding the SYNC block signal SB3 composed of 9 bits×76 words into the SYNC block signal SB1 composed of 8 bits×85 words, and then, the conversion controller 61a outputs the SYNC block signal SB1. In this case, the conversion controller 61a does not execute any bit width decoding of the error information signal ER3.

In the modified preferred embodiment constituted as described above, each of the data 207 and 208 of the error pointers of the transmission data TD shown in FIG. 5 is data of the error pointer of the SYNC block signal SB1 before the bit width conversion, where one word is composed of 8 bits. In particular, the bit width conversion is not executed for the error information signal. Accordingly, the constitution of the present modified preferred embodiment has an advantageous effect of being simple as compared to the constitution of FIG. 1.

MODIFIED OTHER PREFERRED EMBODIMENTS

In the above-mentioned preferred embodiment, the transmission apparatus 2 comprises the bit width converter 10, however, the present invention is not limited to this. The bit width converter 10 may be excluded.

In the above-mentioned preferred embodiment, the reception apparatus 4 comprises the bit width restorer 60, however, the present invention is not limited to this. The bit width restorer 60 may be excluded.

In the above-mentioned preferred embodiment, the transmission data TD includes signals such as a video signal, an audio signal and the like. However, the present invention is not limited to this, and the transmission data TD may include at least the video signal. In this case, the error location information, which is indicated by the error pointer, indicates the error location information of the head of the error in the block of the video signal.

ADVANTAGEOUS EFFECTS OF PREFERRED EMBODIMENTS

As described above, according to the preferred embodiments of the present invention, the decompression apparatus 5 at the side of the reception apparatus performs the normal typical decompression regardless of presence or absence of uncorrectable error, and this leads to preventing from occurrence of the noise. Thus, the decompression apparatus 5 decompresses only the normal information and executes any appropriate processing other than the typical processing, for the erroneous information, and this leads to reduction of the noise.

Moreover, when the error occurs during transmission after the bit width conversion, a loss of the data can be minimized.

Furthermore, the error information signal indicating the location of the error of each word in each block is transmitted after the error information signal is converted into a signal of an error pointer indicating a head location of the error in each block. Therefore, the error information can be efficiently transmitted from the transmission apparatus 2 to the reception apparatus 4.

Therefore, furthermore, the transmission system using these methods is constructed, and this leads to that high-quality transmission having few noises and errors can be realized.

As described above, although the present invention has been described in detail by referring to the preferred embodiments, the present invention is not limited to these embodiments. It will be obvious to those skilled in the art that many preferred variations and modifications of the present invention are possible within the technical scope of the present invention as specified in the appended claims.

What is claimed is:

1. A transmission apparatus operable to transmit a plurality of blocks of data, said transmission apparatus comprising:

information generating means for generating error location information at which an error occurs in each block, in accordance with a data signal including a video signal composed of a predetermined first number of words and generated for each block, and an error information signal indicating presence or absence of the error corresponding to the data signal; and transmitting means for multiplexing the error location information generated by said information generating means and the data signal into a multiplexed signal, and transmitting the multiplexed signal through a transmission line.

2. The transmission apparatus as claimed in claim 1, wherein the error location information indicates information of a head location of the error in the block of the data signal.

3. The transmission apparatus as claimed in claim 1, wherein the error location information indicates information of a head location of the error in the block of the video signal.

4. The transmission apparatus as claimed in claim 1, wherein said transmission line is a digital data transmission line in conformity with a standard for SDTI (Serial Data Transport Interface) specified by SMPTE (Society of Motion Picture and Television Engineers) 305M.

5. The transmission apparatus as claimed in claim 1, further comprising:

converting means for converting a data signal including a video signal composed of a predetermined second number of words and generated for each block, into a data signal including a video signal composed of the first number of words and generated for each block, and outputting the converted data signal to said information generating means and said transmitting means.

6. A reception apparatus operable to receive a plurality of blocks of data, said reception apparatus comprising:

receiving means for receiving a transmission data signal including a data signal and an error pointer signal through a transmission line, the data signal including a video signal composed of a predetermined first number of words and generated for each block, the error pointer signal indicating error location information at which an error occurs corresponding to the data signal;

demultiplexing means for demultiplexing the transmission data signal received by said receiving means into the data signal and the error pointer signal, and outputting the data signal and the error pointer signal; and information generating means for generating error information indicative of presence or absence of the error corresponding to the data signal in accordance with the error pointer signal demultiplexed by said demultiplexing means.

7. The reception apparatus as claimed in claim 6, wherein the error location information indicates information of a head location of the error in the block of the data signal.

8. The reception apparatus as claimed in claim 6, wherein the error location information indicates information of a head location of the error in the block of the video signal.

9. The reception apparatus as claimed in claim 6, wherein said transmission line is a digital data transmission line in conformity with a standard for SDTI (Serial Data Transport Interface) specified by SMPTE (Society of Motion Picture and Television Engineers) 305M.

10. The reception apparatus as claimed in claim 6, further comprising:

converting means for converting the data signal outputted from said demultiplexing means and including the video signal composed of the first number of words and generated for each block, into a data signal including the video signal composed of a predetermined second number of words and generated for each block, and outputting the converted data signal.

11. A transmission method of transmitting a plurality of blocks of data, said transmission method comprising:

generating error location information which an error occurs in each block, in accordance with a data signal including a video signal composed of a predetermined first number of words and generated for each block, and an error information signal indicating presence or absence of the error corresponding to the data signal; and multiplexing the generated error location information and the data signal into a multiplexed signal, and transmitting the multiplexed signal through a transmission line.

12. The transmission method as claimed in claim 11, wherein the error location information indicates information of a head location of the error in the block of the data signal.

13. The transmission method as claimed in claim 11, wherein the error location information indicates information of a head location of the error in the block of the video signal.

14. The transmission method as claimed in claim 11, wherein said transmitting the multiplexed signal through a transmission line comprises transmitting the multiplexed signal through a digital data transmission line in conformity with a standard for SDTI (Serial Data Transport Interface) specified by SMPTE (Society of Motion Picture and Television Engineers) 305M.

15. The transmission method as claimed in claim 11, further comprising:

converting a data signal including a video signal composed of a predetermined second number of words and generated for each block, into a data signal including a video signal composed of the first number of words and generated for each block.

16. A reception method of receiving a plurality of blocks of data, said reception method comprising:

receiving a transmission data signal including a data signal and an error pointer signal through a transmission line, the data signal including a video signal composed of a predetermined first number of words and generated for each block, the error pointer signal indicating error location information at which an error occurs corresponding to the data signal;

demultiplexing the received transmission data signal into the data signal and the error pointer signal, and outputting the data signal and the error pointer signal; and generating error information indicative of presence or absence of the error corresponding to the data signal, in accordance with the demultiplexed error pointer signal.

17. The reception method as claimed in claim 16, wherein the error location information indicates information of a head location of the error in the block of the data signal.

18. The reception method as claimed in claim 16, wherein the error location information indicates information of a head location of the error in the block of the video signal.

19. The reception method as claimed in claim 16, wherein said receiving a transmission data signal through a transmission line comprises receiving a transmission data signal through a digital data transmission line in conformity with the standard for SDTI (Serial Data Transport Interface) specified by SMPTE (Society of Motion Picture and Television Engineers) 305M.

20. The reception method as claimed in claim 16, further comprising:

converting a data signal including a video signal composed of the first number of words and generated for each block, into a data signal including a video signal composed of a predetermined second number of words and generated for each block, and outputting the converted data signal.

* * * * *

UNITED STATES PATENT AND TRADEMARK OFFICE
CERTIFICATE OF CORRECTION

PATENT NO. : 6,684,360 B1
DATED : January 27, 2004
INVENTOR(S) : Asanobu Ito et al.

It is certified that error appears in the above-identified patent and that said Letters Patent is hereby corrected as shown below:

<u>Title page,</u>
Item [30], Foreign Application Priority Data, please delete:
"Dec. 25, 1998 (JP)…………………………..10-371478"

Signed and Sealed this

Twenty-ninth Day of June, 2004

JON W. DUDAS
*Acting Director of the United States Patent and Trademark Office*